United States Patent
Ye

(10) Patent No.: US 8,056,990 B2
(45) Date of Patent: Nov. 15, 2011

(54) COMPUTER ENCLOSURE AND FAN MOUNTING APPARATUS THEREOF

(75) Inventor: Zhen-Xing Ye, Shenzhen (CN)

(73) Assignees: Hong Fu Jin Precision Industry (ShenZhen( Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 307 days.

(21) Appl. No.: 12/545,044

(22) Filed: Aug. 20, 2009

(65) Prior Publication Data

US 2011/0025174 A1 Feb. 3, 2011

(30) Foreign Application Priority Data

Jul. 30, 2009 (CN) .......................... 2009 1 0305015

(51) Int. Cl.
*A47B 81/00* (2006.01)
*H05K 7/20* (2006.01)
*F01D 25/26* (2006.01)

(52) U.S. Cl. ................... 312/223.2; 361/695; 415/213.1

(58) Field of Classification Search ............... 312/223.2, 312/210, 213; 248/274.1, 346.07, 918; 40/739, 40/740, 741, 742, 606.13; 454/184; 52/645, 52/656.1–656.7, 656.9; 361/695, 679.48, 361/690, 692; 415/213.1; 165/80.3, 104.33, 165/122; 174/151, 16.1
See application file for complete search history.

(56) References Cited

U.S. PATENT DOCUMENTS

| | | | |
|---|---|---|---|
| 3,295,674 A * | 1/1967 | Shore | 206/447 |
| 3,451,153 A * | 6/1969 | Dohanyos | 40/741 |
| 3,470,644 A * | 10/1969 | Craig | 40/706 |
| 3,936,968 A * | 2/1976 | Gilbert | 40/783 |
| 4,560,078 A * | 12/1985 | Dubuisson | 220/4.26 |
| 4,564,091 A * | 1/1986 | Coneglio | 190/11 |
| 4,890,839 A * | 1/1990 | Ayotte | 273/157 R |
| 5,383,721 A * | 1/1995 | Thomas | 312/7.2 |
| 5,418,642 A * | 5/1995 | Bende | 359/450 |
| 5,579,596 A * | 12/1996 | Kovacs et al. | 40/739 |
| 5,913,501 A * | 6/1999 | Heuss et al. | 248/346.07 |
| 5,921,056 A * | 7/1999 | Weiss et al. | 52/745.16 |
| 6,076,309 A * | 6/2000 | Daoud | 52/62 |
| 6,310,771 B1 * | 10/2001 | Chien | 361/697 |
| 6,370,803 B1 * | 4/2002 | Burquest | 40/607.04 |
| 6,377,320 B1 * | 4/2002 | Ananian et al. | 348/836 |
| 6,709,078 B2 * | 3/2004 | Johnson | 312/205 |
| 7,090,187 B2 * | 8/2006 | Tusavitz | 248/346.07 |
| 7,611,117 B1 * | 11/2009 | Lang, Jr. | 248/452 |
| 7,681,856 B1 * | 3/2010 | Thomas et al. | 248/442.2 |
| 2006/0268500 A1 * | 11/2006 | Kuhn | 361/683 |
| 2007/0089374 A1 * | 4/2007 | Vasta | 52/204.2 |
| 2007/0155301 A1 * | 7/2007 | Chen et al. | 454/184 |
| 2010/0182738 A1 * | 7/2010 | Visser et al. | 361/679.01 |

* cited by examiner

*Primary Examiner* — David Dunn
*Assistant Examiner* — Ryan A Doyle
(74) *Attorney, Agent, or Firm* — Altis Law Group, Inc.

(57) ABSTRACT

A computer enclosure includes a front panel having a ventilation area. The disclosure provides a fan mounting apparatus. The fan mounting apparatus is mounted on an inner wall of the front panel. The fan mounting apparatus includes four mounting frames respectively mounted on four cover of the ventilation area of the front panel. A number of screw holes are defined in the four mounting frames for mounting a plurality of types of fans. The fan mounting apparatus further includes four first blocking beams each interference fitted into the two top ends of two corresponding mounting frames and four second blocking beams each embed in a corresponding first blocking beam, and capable of being slid in the corresponding first blocking beam.

10 Claims, 8 Drawing Sheets

COMPUTER ENCLOSURE AND FAN MOUNTING APPARATUS THEREOF

BACKGROUND

1. Technical Field

The present disclosure relates to computer enclosures and, particularly, to a computer enclosure and a mounting apparatus for mounting a fan on the computer enclosure.

2. Description of Related Art

A system fan is typically secured to a panel of a computer enclosure by screws engaging in mounting holes around a ventilation area of the panel, to dissipate heat so as to assure electrical components in the computer enclosure run within a desired temperature range.

When the electrical components are changed, a different sized fan may be required. However, it is hard to attach the new fan to the panel by screws engaging in the original mounting holes. Furthermore, even if the new fan is successfully attached to the panel, the original ventilation holes may not properly align with the new fan and cause turbulent airflow.

DETAILED DESCRIPTION

Figure 1:
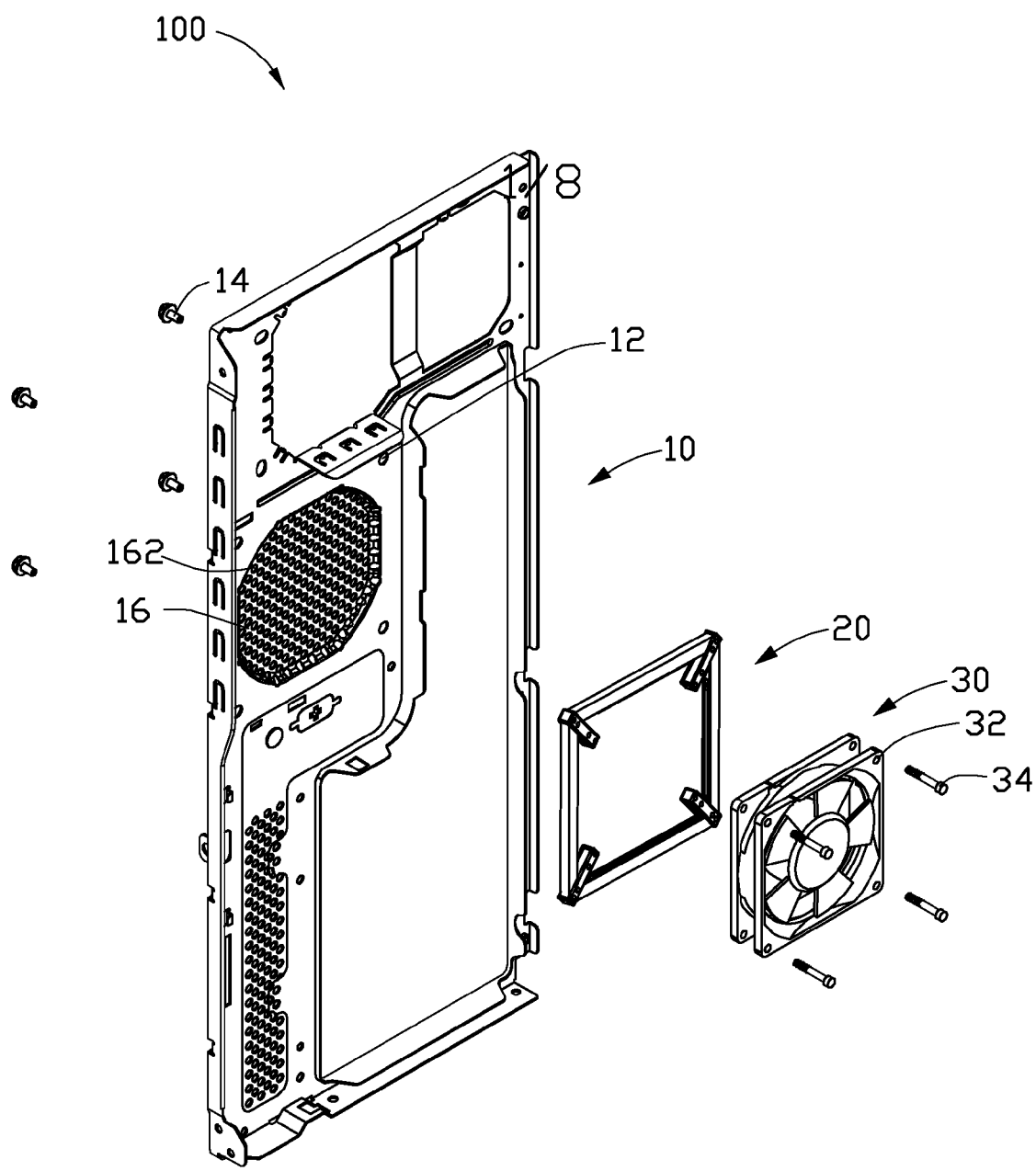
FIG. 1 is an exploded, isometric view of an exemplary embodiment of a computer enclosure.
Figure 7:
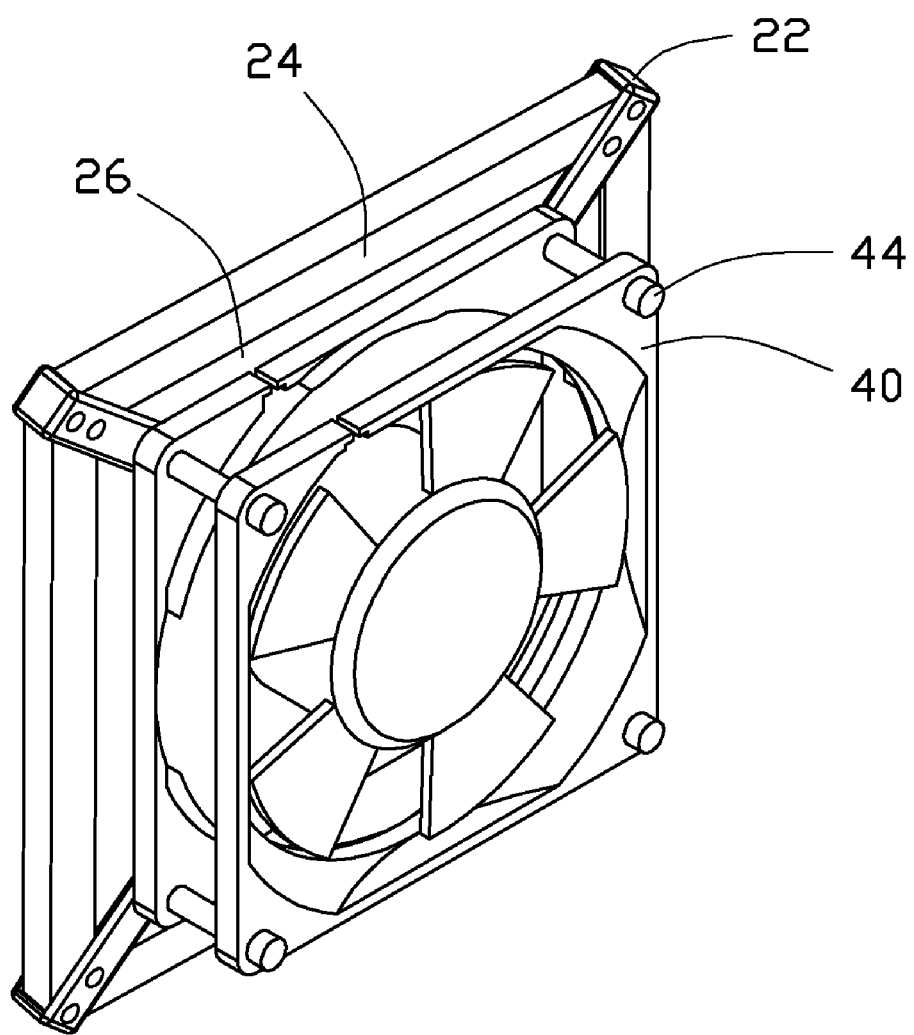
FIG. 7 is an assembled view of the fan mounting apparatus of FIG. 2, together with a second type of system fan.
Figure 8:
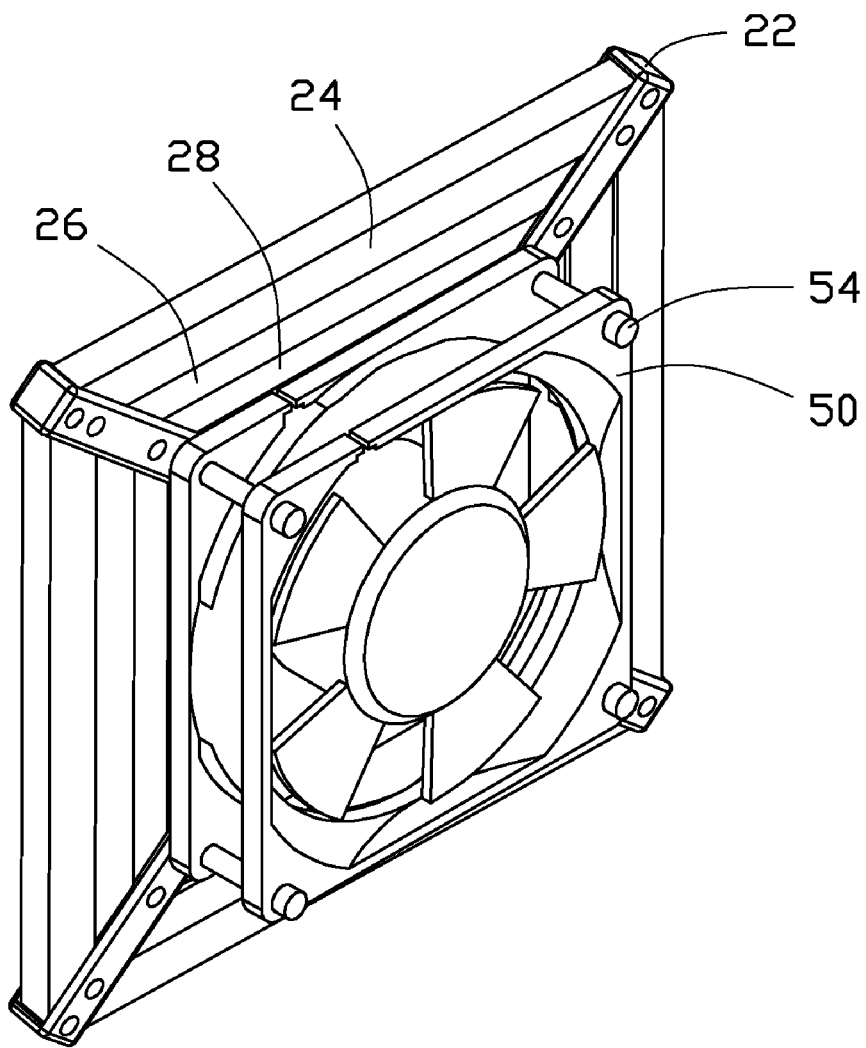
FIG. 8 is an assembled view of the fan mounting apparatus of FIG. 2, together with a third type of system fan.

Referring to FIG. 1, an exemplary embodiment of a computer enclosure 100 able to mount system fans of different sizes, such as a 120 mm system fan 30 (see FIG. 6), a 90 mm system fan 40 (see FIG. 7), and a 80 mm system fan 50 (see FIG. 8). The computer enclosure 100 includes a front panel 10, and a fan mounting apparatus 20.

The front panel 10 includes a ventilation area 16, and four mounting holes 12 around the ventilation area 16. The ventilation area 16 includes a plurality of ventilation holes 162 defined therein.

Figure 2:
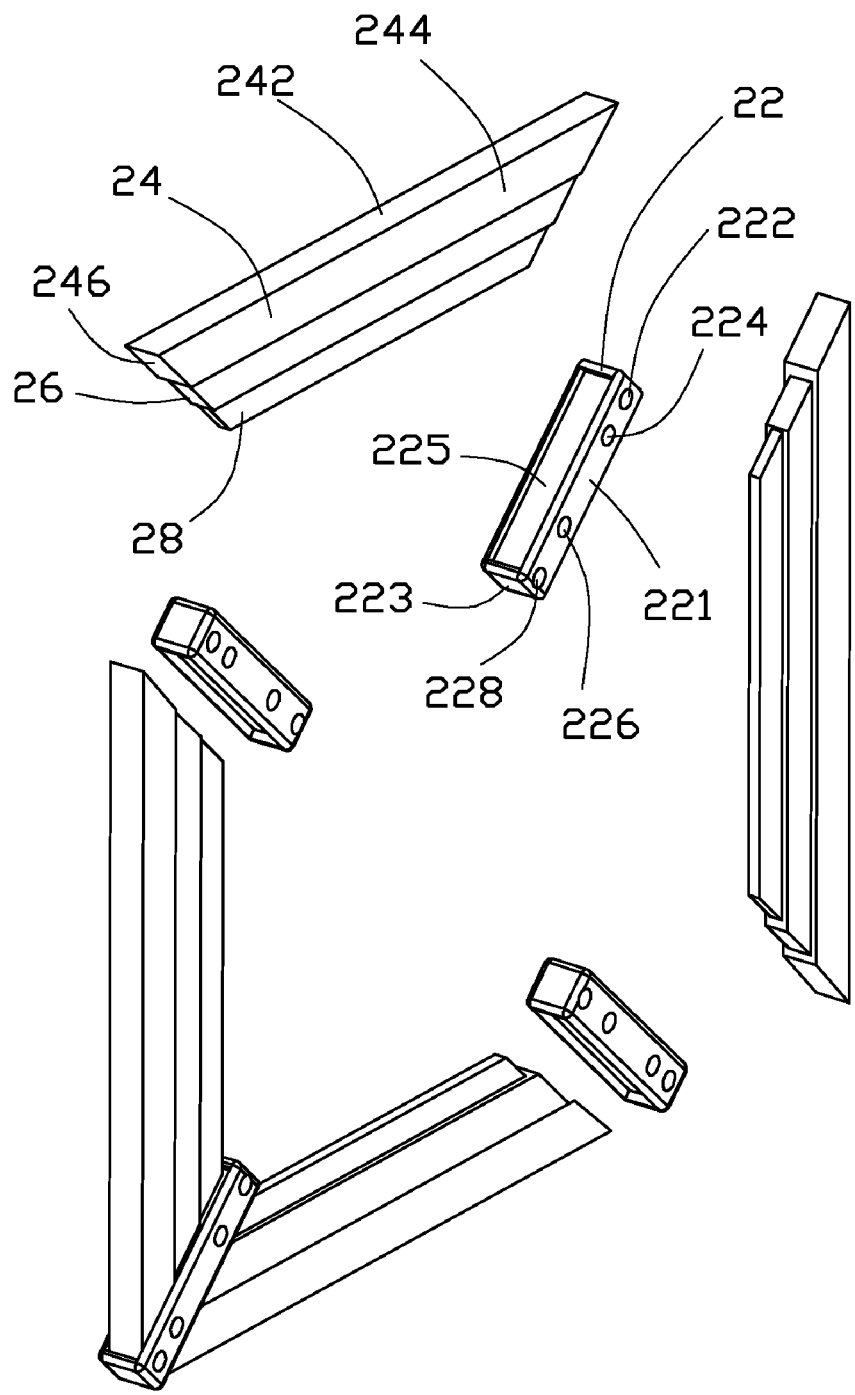
FIG. 2 is an exploded, isometric view of an exemplary embodiment of a fan mounting apparatus of the computer enclosure of FIG. 1.

Referring to FIG. 2, in one embodiment, the fan mounting apparatus 20 is approximately rectangular-shaped, and includes four mounting frames 22, and four sets of blocking members. Each set of the blocking members includes a first blocking beam 24, a second blocking beam 26, and a third blocking beam 28, retractably connected to each other.

Each of the mounting frames 22 includes a pair of long opposite sidewalls 221 and a pair of short opposite sidewalls 223 perpendicular to the short sidewalls, cooperatively defining a receiving space 225. A mounting hole 222 is defined in one end of the pair of long sidewalls 221 of each mounting frame 22, corresponding to the mounting holes 12 of the front panel 10. A first screw hole 224, a second screw hole 226, and a third screw hole 228 are sequentially defined in the pair of long sidewalls 221 of each mounting frame 22, besides the mounting holes 12.

The four first blocking beams 24, the four second blocking beams 26, and the four third blocking beams 28 are approximately trapeziform-shaped. Each of the four first blocking beams 24, the four second blocking beams 26, and the four third blocking beams 28 respectively correspond to the system fans 30, 40, 50 and includes a base wall 242, a pair of long sidewalls 244 extending perpendicularly from two opposite sides of the base wall 242, and a pair of short sidewalls 246 slantingly extending from two opposite ends of the base wall 242 at a certain degree. The base wall 242 and sidewalls 244 of each of the blocking beams 24, 26, 28 cooperatively define a receiving space. A size of each of the blocking beams 24, 26, 28 in cross-section gradually become smaller along a direction away from the base wall 242 thereof. Each of the second blocking beams 26 is capable of being retractably slid into the receiving space of the corresponding first blocking beam 24. Each of the third blocking beams 28 is capable of being retractably slid into the receiving space of the corresponding second blocking beam 26. In other embodiments, the number of the blocking beams can be changed according to requirements.

Figure 3:
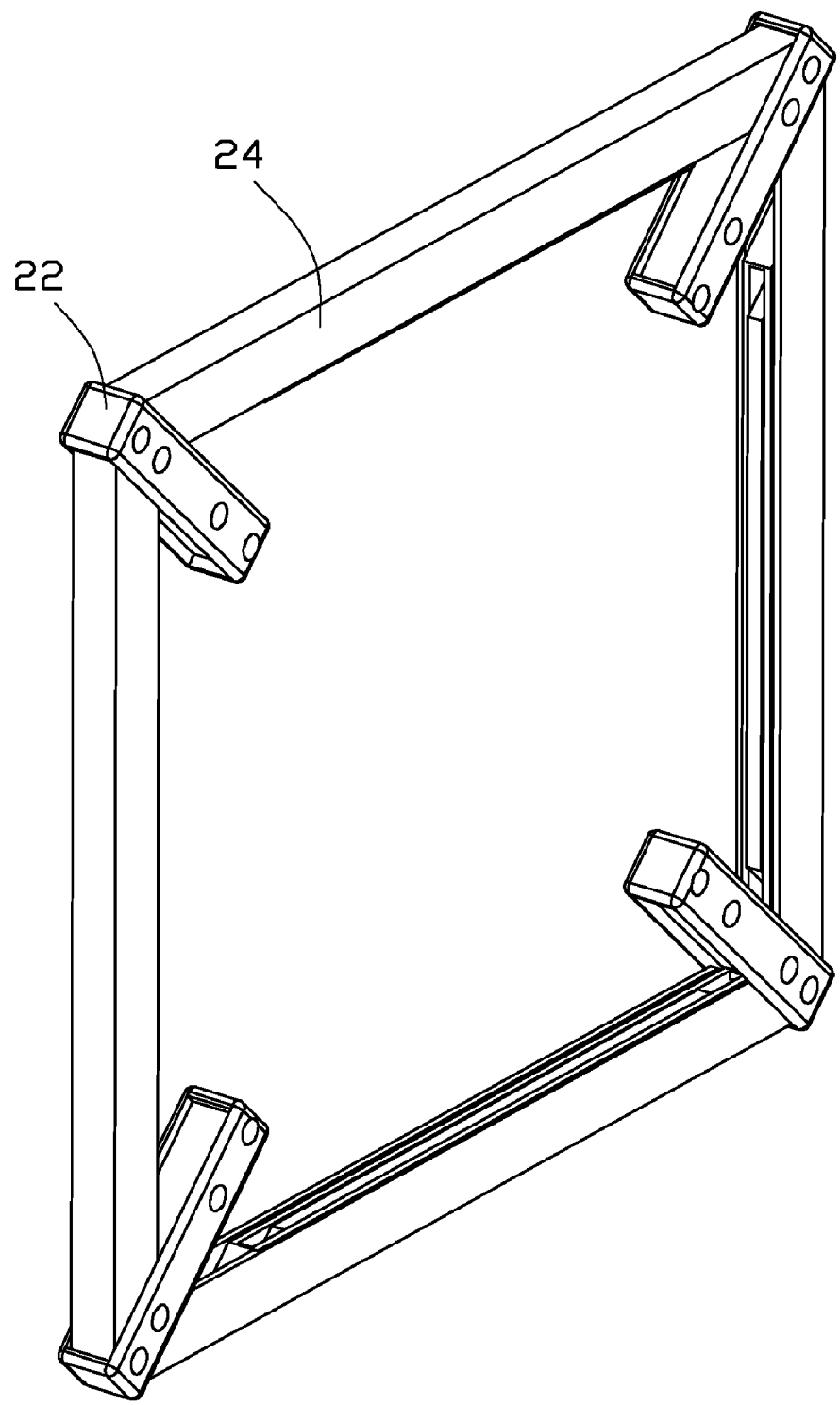
FIG. 3 is an assembled view of the fan mounting apparatus of FIG. 2, in a first state.
Figure 4:
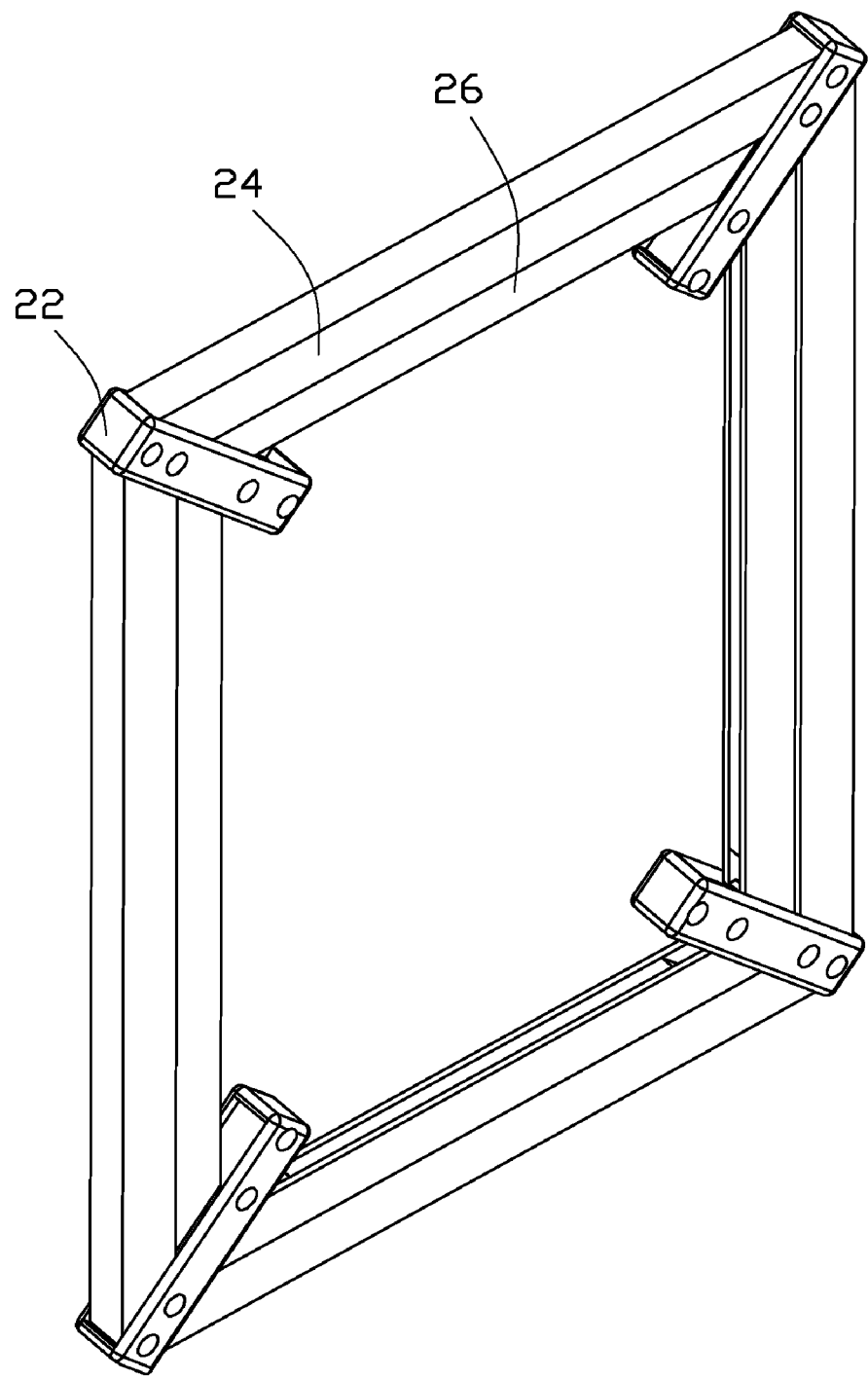
FIG. 4 is an assembled view of the fan mounting apparatus of FIG. 2, in a second state.
Figure 5:
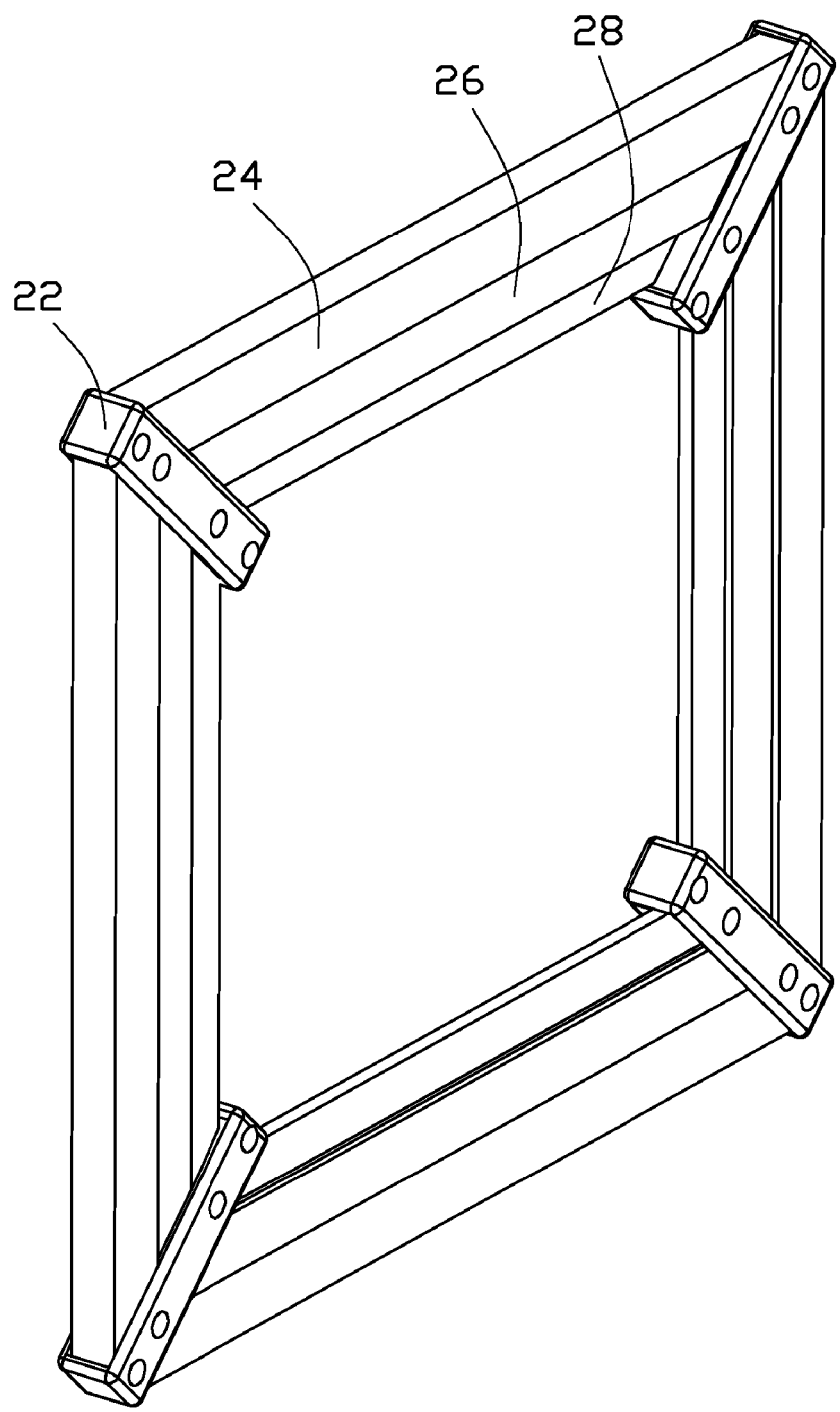
FIG. 5 is an assembled view of the fan mounting apparatus of FIG. 2, in a third state.

Referring to FIGS. 3 to 5, in assembly of the fan mounting apparatus 20, two ends of each of the first blocking beams 24 are interferentially fitted into an upper portion of the receiving space of two corresponding mounting frames 22, with the mounting frames 22 angled with the base walls 242 of the first blocking beams 24. The four second blocking beams 26 are retractably received in the receiving spaces of the first blocking beams 24. The four third blocking beams 28 are retractably received in the receiving spaces of the second blocking beams 26. Thus, the fan mounting apparatus 20 is obtained. The four first blocking beams 22 form four sides of the fan mounting apparatus 20, and the four mounting frames 22 are positioned on four corners of the fan mounting apparatus 20. The fan mounting apparatus 20 has three working states. Referring to FIG. 3, in a first working state, the second blocking beams 26 and the third blocking beams 28 are both positioned in the first blocking beams 24. Referring to FIG. 4, in a second working state, the second blocking beams 26 are pulled out of the first blocking beams 24, and the third blocking beams 28 are positioned in the second blocking beams 26. Referring to FIG. 5, in a third working state, the second blocking beams 26 extend out of the first blocking beams 24, and the third blocking beams 28 are pulled out of the second blocking beams 26.

Figure 6:
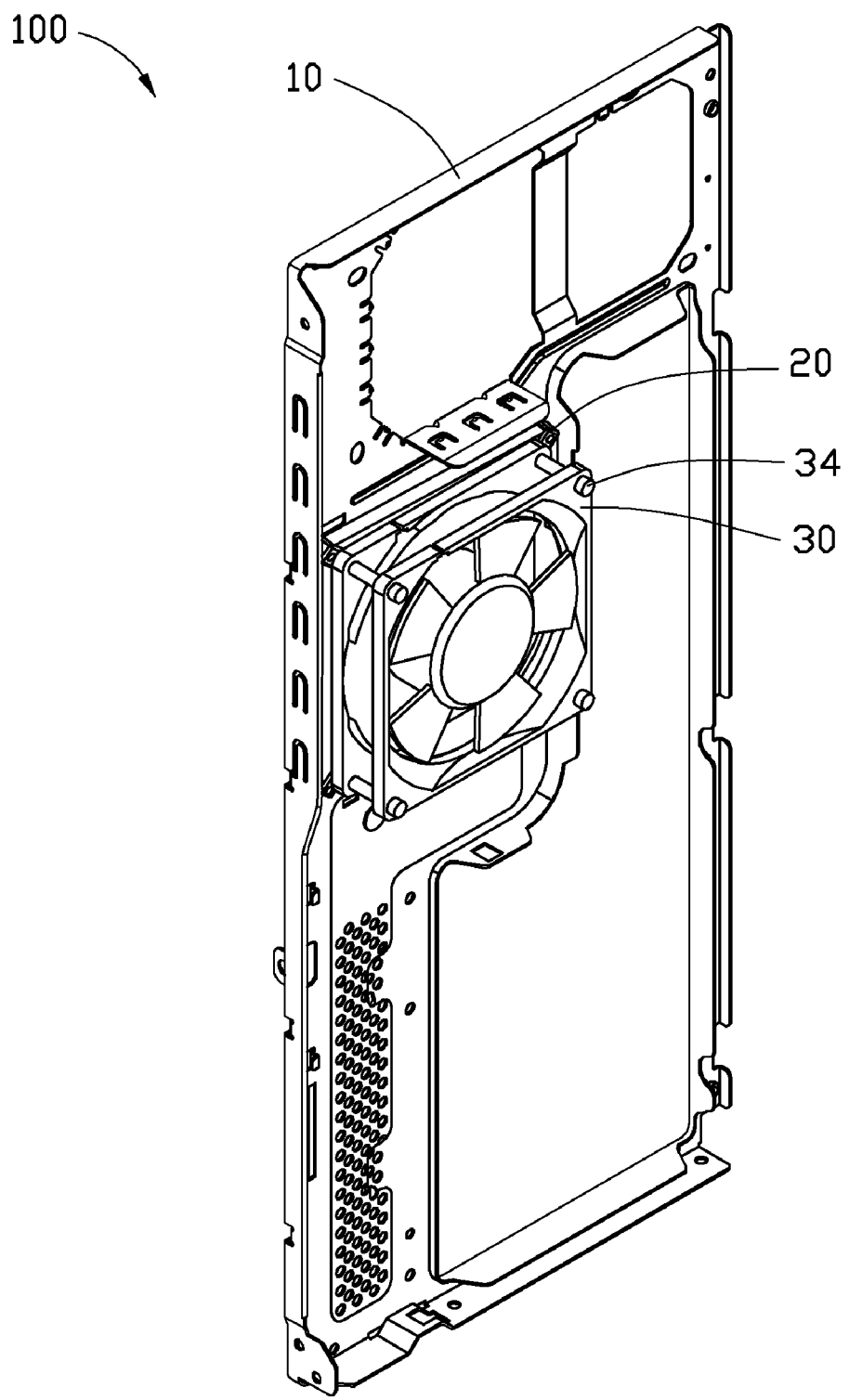
FIG. 6 is an assembled view of the computer enclosure of FIG. 1, together with a first type of system fan.

Referring to FIGS. 3 and 6, four screws 14 extend through the four mounting holes 162 of the front panel 10 to engage in the four mounting holes 222 of the fan mounting apparatus 20, to attach the fan mounting apparatus 20 to the front panel 10. Four screws 34 extend through the mounting holes 32 of the system fan 30 to engage in the first screw holes 224, to attach the system fan 30 to the fan mounting apparatus 20. At this time, the first blocking beams 24 block portions of the ventilation area 16 around the system fan 30, for preventing turbulent airflow.

Referring to FIGS. 4 and 7, four screws 44 extend through mounting holes of the fan 40 to engage in the second screw holes 226, to attach the system fan 40 to the fan mounting apparatus 20. At this time, the first blocking beams 24 and the second blocking beams 26 cooperatively block portions of portions of the ventilation area 16 around the system fan 40, for preventing turbulent airflow.

Referring to FIGS. 5 and 8, four screws 54 extend through mounting holes of the fan 50 to engage in the third screw holes 228, to attach the system fan 50 to the fan mounting apparatus 20. At this time, the first blocking beams 24, the second blocking beams 26, and the third blocking beams 28 cooperatively block portions of the ventilation area 16 around the system fan 50, for preventing turbulent airflow.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A computer enclosure, comprising: a front panel comprising a ventilation area with four mounting holes located therearound; and a fan mounting apparatus mounted on the front panel, the fan mounting apparatus comprising: four mounting frames respectively mounted around the ventilation area of the front panel, with a plurality of fasteners extending through the mounting holes of the front panel to engage with the mounting frames, a plurality of mounting holes defined in each of the four mounting frames for mounting a fan with different sizes; four first blocking beams attached to the mounting frames, two ends of each first blocking beams received in two corresponding adjacent mounting frames; and four second blocking beams each embed in a corresponding first blocking beam, and capable of being slid in the corresponding first blocking beam between a first working state embedded within the first blocking beam to define a first blocking portion and a second working state extended from the first blocking beam to define a second larger blocking portion of the ventilation area for preventing turbulent airflow.

2. The computer enclosure of claim 1, wherein the fan mounting apparatus further comprises four third blocking beams each connected with a corresponding second blocking beam, and capable of being slid in the corresponding second blocking beam.

3. The computer enclosure of claim 1, wherein a plurality of ventilation holes are defined in the ventilation area of the front panel evenly.

4. The computer enclosure of claim 1, wherein a mounting hole is defined in top ends of two opposite sidewalls of each of the mounting frames for mounting the fan mounting apparatus on the front panel.

5. A fan mounting apparatus for mounting a plurality of types of fans on a ventilation area of a front panel of a computer enclosure, the fan mounting apparatus comprising: four mounting frames respectively configured to be mounted on four corners of the ventilation area of the front panel, wherein a plurality of screw holes are defined in the four mounting frames for mounting one of the plurality of types of fans; four first blocking beams, two ends of each first blocking beams interference fitted into two corresponding adjacent mounting frames; and four second blocking beams each connected with a corresponding first blocking beam, and capable of being slid in the corresponding first blocking beam between a first working state embedded within the first blocking beam to define a first blocking portion and a second working state extended from the first blocking beam to define a second larger blocking portion of the ventilation area for preventing turbulent airflow.

6. The fan mounting apparatus of claim 5, further comprising four third blocking beams each connected with a corresponding second blocking beam, and capable of being slid in the corresponding second blocking beam.

7. The fan mounting apparatus of claim 5, wherein a mounting hole is defined in top ends of two opposite sidewalls of each of the mounting frames for mounting the fan mounting apparatus on the front panel.

8. A computer enclosure, comprising: a panel comprising a ventilation area; a fan mounting apparatus attached to the panel corresponding to the ventilation area and comprising: a plurality of mounting frames attached to the panel around the ventilation area, a plurality of mounting holes defined in each of the mounting frames; and a plurality of sets of mounting members attached to the mounting frames, each set of mounting members located between two adjacent mounting frames and comprising a plurality of retractable blocking beams; and a fan attached to the mounting frames by fasteners engaging in the corresponding mounting holes of the mounting frames according a size of the fan; wherein said plurality of retractable blocking beams define a plurality of blocking portions of the ventilation area for preventing turbulent airflow.

9. The computer enclosure of claim 8, wherein the plurality of mounting frames comprise four mounting frames and the plurality of retractable blocking beams comprise four sets of retractable blocking members.

10. The computer enclosure of claim 9, wherein each set of the retractable blocking members comprises a first blocking beam, a second blocking beam, and a third blocking beam.

* * * * *